United States Patent
Konishi et al.

(10) Patent No.: US 8,716,874 B2
(45) Date of Patent: May 6, 2014

(54) SEMICONDUCTOR DEVICE HAVING METAL POSTS NON-OVERLAPPING WITH OTHER DEVICES AND LAYOUT METHOD OF SEMICONDUCTOR DEVICE

(75) Inventors: Junichi Konishi, Hyogo (JP); Naohiro Ueda, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 17 days.

(21) Appl. No.: 13/228,583

(22) Filed: Sep. 9, 2011

(65) Prior Publication Data

US 2012/0061828 A1 Mar. 15, 2012

(30) Foreign Application Priority Data

Sep. 15, 2010 (JP) ................................. 2010-206767

(51) Int. Cl.
  *H01L 29/40* (2006.01)
(52) U.S. Cl.
  USPC .......................................... 257/778; 257/737
(58) Field of Classification Search
  USPC ................................. 257/737, 778
  See application file for complete search history.

(56) References Cited

U.S. PATENT DOCUMENTS

| 7,012,339 | B2 | 3/2006 | Terui | |
| 7,253,520 | B2* | 8/2007 | Yoshida et al. | 257/738 |
| 7,735,375 | B2 | 6/2010 | Ueda et al. | |
| 7,977,229 | B2* | 7/2011 | Ohuchi et al. | 438/598 |
| 8,168,470 | B2* | 5/2012 | Lin et al. | 438/107 |
| 2009/0230542 | A1* | 9/2009 | Lin et al. | 257/700 |
| 2010/0301459 | A1* | 12/2010 | Akiba et al. | 257/737 |

FOREIGN PATENT DOCUMENTS

| JP | 2000-299406 | 10/2000 |
| JP | 3808030 | 5/2006 |
| JP | 4058630 | 12/2007 |
| JP | 4512125 | 5/2010 |

* cited by examiner

*Primary Examiner* — James Mitchell
(74) *Attorney, Agent, or Firm* — Cooper & Dunham LLP

(57) ABSTRACT

A semiconductor device that is resin-sealed in a wafer level after a rewiring layer forming process and a metal post forming process forming a metal post are performed on a semiconductor substrate of the semiconductor device includes devices formed on the semiconductor substrate. Further all of the devices are disposed in respective positions other than positions overlapping a peripheral border of the metal post when viewed from a top of the semiconductor substrate.

10 Claims, 5 Drawing Sheets

SEMICONDUCTOR DEVICE HAVING METAL POSTS NON-OVERLAPPING WITH OTHER DEVICES AND LAYOUT METHOD OF SEMICONDUCTOR DEVICE

CROSS-REFERENCE TO RELATED APPLICATIONS

The present application claims priority under 35 U.S.C §119 to Japanese Patent Application No. 2010-206767 filed Sep. 15, 2010, the entire contents of which are hereby incorporated herein by reference.

BACKGROUND OF THE INVENTION

1. Field of the Invention

The present invention generally relates to a semiconductor device and a layout method of the semiconductor device.

2. Description of the Related Art

Recently, demands for reducing the size of the semiconductor chip, higher integration of components in the semiconductor chip, and higher performance of the semiconductor chip have become very significant. In response to the demands, the surface amount technology as a packaging technique that satisfies the demands has become more and more important. As the surface amount technology, much attention is attracted to the BGA (Ball Grid Array), the CSP (Chip Size Package), the WL-CSP (Wafer-Level Chip Size Package) and the like. In the BGA, solder balls are in contact with a printed circuit without using lead frames. In the CSP, the package size is substantially equal to the chip size. Further, the CSP is adopted to achieve downsizing and higher performance. The WL-CSP is described in, for example, Japanese Patent No. 3808030 and Japanese Patent Application Publication No. 2000-299406.

The WL-CSP is manufactured by performing a rewiring process, a metal post forming process, a resin sealing process, a ball forming process and the like on a surface of a wafer that has been manufactured through an LSI (Large Scale Integration) manufacturing process.

FIG. 1 is a schematic cross-sectional view illustrating a part of the WL-CSP. With reference to FIG. 1, a method of manufacturing the WL-CPS is described.

First, a base insulation layer 3 is formed on a semiconductor substrate 1. After elements (devices) (not shown) including active devices (e.g., transistors) and passive devices (e.g., resistors and capacitors) are formed, a base insulation layer 5 including a BPSG (borophosphosilicate glass) film or the like is formed on the entire surface of the semiconductor substrate 1. After forming connection holes (not shown) through the base insulation layer 5, for example, Al wirings (not shown) made of Al (Aluminum) and an Al electrode pad 7 are formed on the base insulation layer 5.

Further, a passivation film 9 having, for example, a PSG (phosphosilicate glass) as a lower layer and an SiN (silicon nitride) as an upper layer is formed on the entire surface of the semiconductor substrate 1. Further, a polyimide layer 11 is formed on the passivation film 9. Then, a pad opening 13 is formed in the insulation layer on the Al electrode pad 7. This is because the Al electrode pad 7 can establish an electrical contact with a metal wiring layer formed in the back-end process (later) and a probe needle is in contact with the electrode pad 7 in a wafer test performed in the back-end process.

Namely, the wafer test is performed by causing the probe needle to make contact with the Al electrode pad 7.

Then, a sputtering method is performed to form a barrier metal layer 15 made of Cr (Chrome) and an electrode layer (not shown) made of Cu (Copper) for plating on the entire surface of the semiconductor substrate 1. The barrier metal layer 15 is formed between a metal wiring layer made of Cu and formed between the back-end process and the Al electrode pad 7 so as to prevent Cu and Al from intruding into each other.

A photoresist pattern is formed on a predetermined region on the electrode layer for plating, and an electrolytic plating is performed to form a Cu wiring layer 17 and a Cu electrode pad 19. The Cu wiring layer 17 and the Cu electrode pad 19 may be called rewiring layers. As the material of the rewiring layers, Cu is generally used to ensure the reliability due to higher mechanical strength, higher moisture resistance and the like.

After removing the photoresist pattern, a wet etching is performed to remove unnecessary electrode layer for plating and the barrier metal layer 15 by using the Cu wiring layer 17 and the Cu electrode pad 19 as a mask. Then, the sputtering method and an electrolytic plating method are performed to form a metal layer. Further, a patterning is performed on the metal layer using a photoengraving technique and an etching technique to form a metal post 21 on the Cu electrode pad 19.

Then, the wafer, a sealing resin, and a temporary film are disposed in a mold for resin sealing, and heated and pressed in a manner such that the metal post 21 appears on the surface of the sealing resin 23. The temporary film herein is the material to prevent the resin from being in contact with the mold.

After forming a barrier metal layer 25 on the surface of the metal post 21, a solder ball 27 is mechanically adhered to the metal post 21 via the barrier metal layer 25, the metal post 21 being formed on the wafer sealed by the sealing resin 23.

After that, the wafer is cut into chips.

By the resin sealing in a wafer level, the number of processes is reduced and the downsizing of the chips is achieved.

SUMMARY OF THE INVENTION

According to an aspect of the present invention, a semiconductor device that is resin-sealed in a wafer level after a rewiring layer forming process and a metal post forming process forming a metal post are performed on a semiconductor substrate of the semiconductor device includes devices formed on the semiconductor substrates. Further, all of the devices are disposed in respective positions other than positions overlapping a peripheral border of the metal post when viewed from a top of the semiconductor substrate.

BRIEF DESCRIPTION OF THE DRAWINGS

Other objects, features, and advantages of the present invention will become more apparent from the following description when read in conjunction with the accompanying drawings, in which.

DETAILED DESCRIPTION OF THE PREFERRED EMBODIMENTS

Regarding the devices in the WL-CSP, the characteristics measured in the wafer test performed before the packaging process (including the rewiring layer forming process, the metal post forming process, the resin sealing process, and the ball forming process) may differ from the characteristics obtained after the packaging process. This is because the characteristics of the devices have been changed between before the packaging process and after the packaging process. The characteristics change may reduce the reliability of the WL-CSP. Especially, in the WL-CSP including an analog circuit where it is necessary to avoid the characteristics change as much as possible, it may cause a problem when the characteristics change occurs.

The present invention is made in light of the above inconvenience. Namely, according to an embodiment of the present invention, in the semiconductor device and a layout method of the semiconductor where the rewiring layer forming process, the metal post forming process, the resin sealing process are performed and the resin sealing is performed in a wafer level, the difference in the characteristics of the devices on the wafer between before and after the packaging process may be reduced.

Figure 1:
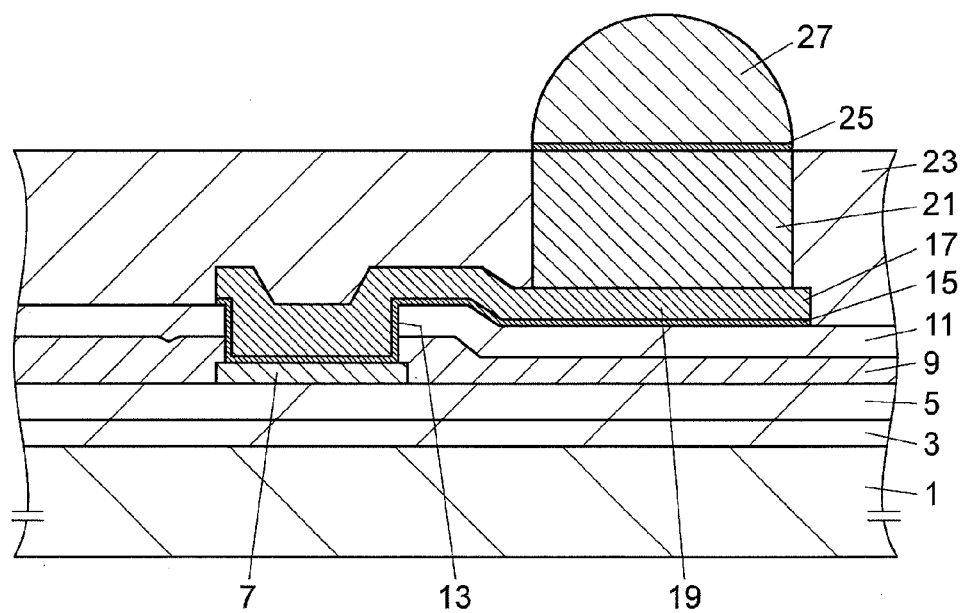
FIG. 1 is a cross-sectional view illustrating a part of a WL-CSP (Wafer-Level Chip Size Package)
Figure 2:
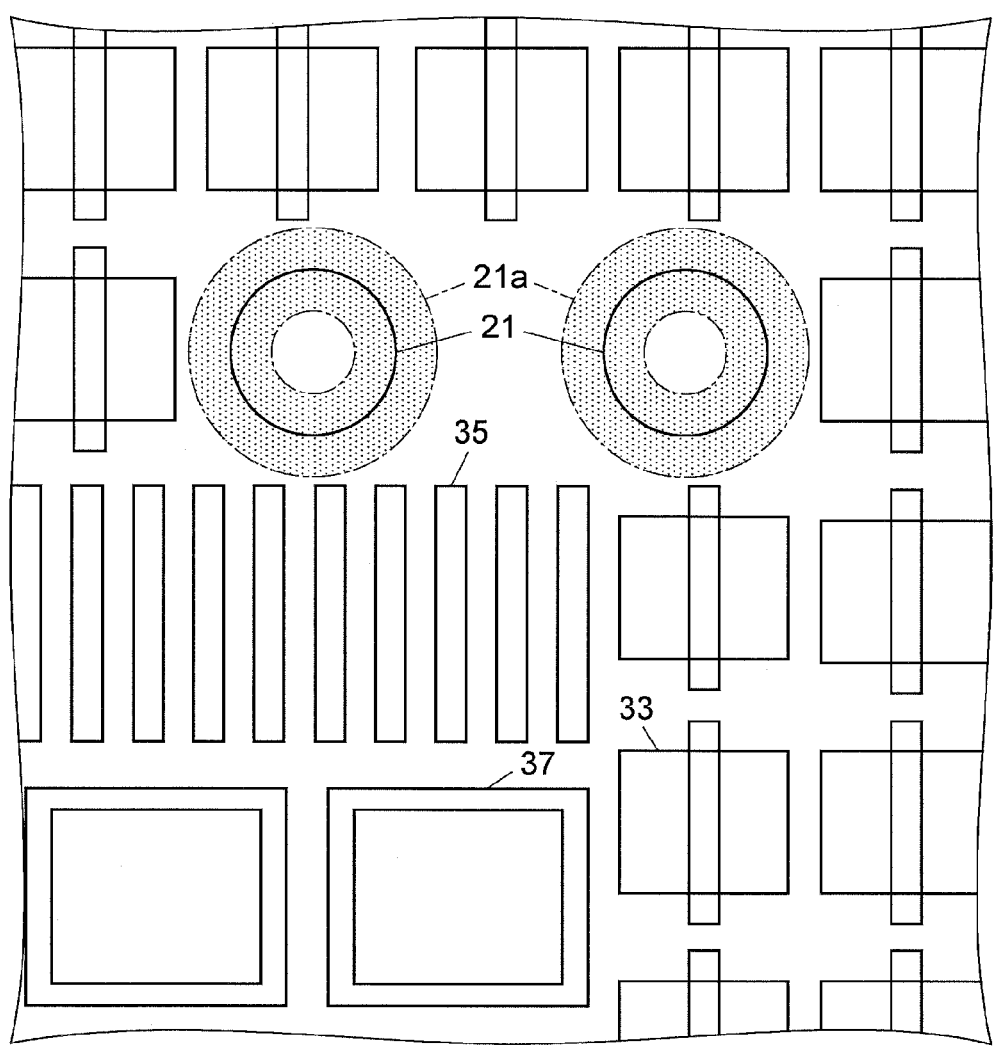
FIG. 2 schematically illustrates a layout of a semiconductor device according to an embodiment of the present invention.

FIG. 2 schematically illustrates a semiconductor device and a layout method of the semiconductor device according to an embodiment of the present invention. More specifically, FIG. 2 schematically illustrates a part of the semiconductor device. In FIG. 2, the ratio of the size of the metal post to the size of the devices does not correspond to the actual ratio.

As illustrated in FIG. 2, there are disposed (formed) plural metal posts 21, and the shape of the metal posts 21 in the horizontal plane (parallel to the sheet of FIG. 2) is circular. In the configuration of FIG. 2, it is assumed that the diameter of the metal posts 21 is 220 μm. The region within a predetermined range from a peripheral border of the metal post 21 is formed as a layout prohibited region 21a. In this example, the layout prohibited region 21a is defined as a region between two concentric circles having the same center as that of the circle of the peripheral border of the metal post 21. One of the two concentric circles has a diameter of 120 μm. The other one of the two concentric circles has a diameter of 320 μm. As result, a range having a distance 50 μm inward and outward from the peripheral border is provided.

Further, as illustrated in FIG. 2, the devices (elements) such as transistors 33, resistive devices (resistors) 35, capacitative devices (capacitors) 37 are disposed in a region (positions) other than the layout prohibited region 21a. For example, the transistors 33 include MOS (Metal Oxide Semiconductor) transistors, bipolar transistors and the like. The resistors 35 include devices made of an impurity diffused layer formed on a semiconductor substrate, the devices formed on polysilicon, devices made of a high-resistivity metal thin layer and the like. The capacitors 37 include devices made of two polysilicon layers in a laminated structure interposed with an insulation layer, devices made of an impurity diffused layer formed on a semiconductor substrate and polysilicon in a laminated structure interposed with an insulation layer and the like.

In FIG. 2, a case is described where there is no device disposed in a region under the metal post 21 and within the layout prohibited region 21a when viewed from the top. However, a device may be disposed in the region.

Further, in FIG. 2, a case is described where there is no device disposed in a position between two metal posts 21 adjacent to each other. However, a device may be disposed in the position.

The inventors of the present invention have studied how metal posts influence devices in the WL-CSP. The results of the study are described with reference to FIGS. 3 and 4.

Figure 3:
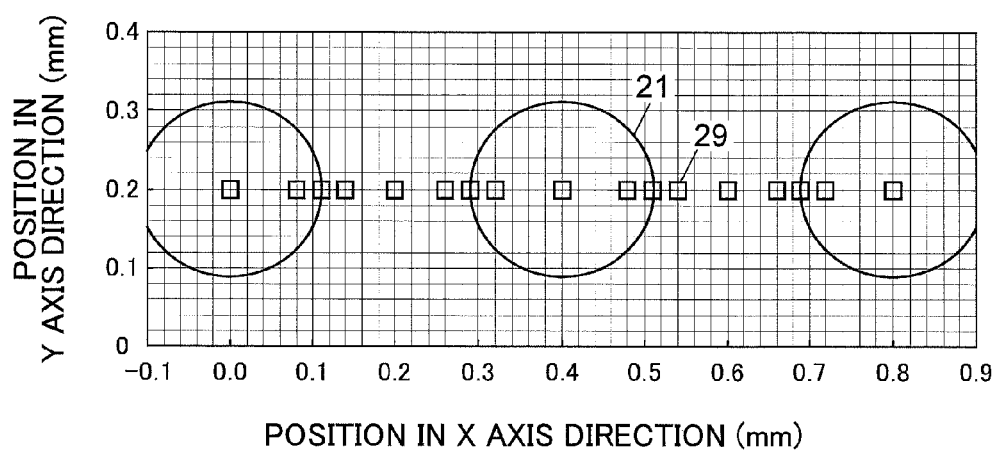
FIG. 3 is a drawing illustrating positions of metal posts and positions where stresses are measured in the WL-CSP.

FIG. 3 illustrates positions (coordinates) where the metal posts 21 are formed (disposed) and the positions (square symbols 29) where stress is measured. In FIG. 3, the lateral axis denotes the position of the wafer in the X axis direction (unit is mm), and the vertical axis denotes the position of the wafer in the Y axis direction (unit is mm). Further, in FIG. 3, reference numerals 21 and 29 denote the metal post and the position (square symbol) where stress is measured, respectively.

Figure 4:
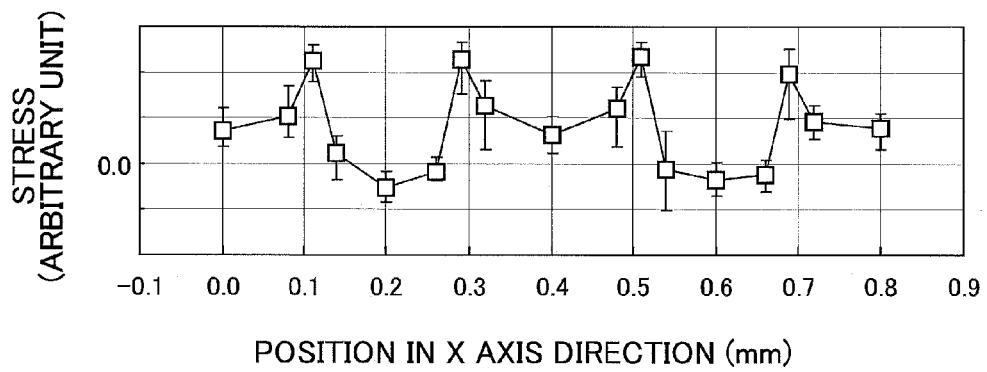
FIG. 4 is a graph illustrating relationships between the positions where stresses are measured and the stresses due to the forming of the metal posts.

FIG. 4 is a graph illustrating a relationship between the position (square symbol) where stress is measured and the stress caused by forming the metal posts. In FIG. 4, the lateral axis denotes the position where stress is measured in the X axis direction (unit is mm), and the vertical axis denotes the stress (with arbitrary unit). Herein, the stress was measured by forming a resistive device (piezoelectric device) at the position where stress is measured in the semiconductor device and by measuring the resistance value before and after the packaging process (i.e., the rewiring layer forming process, the metal post forming process, the resin sealing process, and ball forming process). An example method of measuring the stress is described in Japanese Patent NO. 4512125.

As illustrated in FIG. 4, the stress caused by forming the metal posts becomes smaller as the point where the stress is measured become farther from the peripheral border of the metal post 21. On the other hand, the stress caused by forming the metal posts becomes greater as the point where the stress is measured becomes closer to the peripheral border of the metal post 21. Namely, in the metal post 21, a greater stress is generated at or in the vicinity of the peripheral border of the metal posts 21 than at the center of the metal posts 21. From the viewpoint of the change in the stress from the graph of FIG. 4, in the areas in the vicinity of the center of the metal posts 21 and the areas between and farther from the metal posts 21, the stress changes relatively little (i.e., the graph in the areas is relatively flat). On the other hand, in the vicinity of the peripheral border of the metal posts 21, the stress steeply changes.

As described above, in the WL-CSP, depending on the position relative to the metal post 21, the stress applied to the devices (resistors) changes. In this study, the resistors are used and the resistance of the disposed resistors was measured. However, when stress is applied to devices other than the resistors, it is generally known that the characteristics of the devices may also be changed due to the stress. Namely, when the devices other than the resistors are disposed in the vicinity of the peripheral border of the metal posts 21 and farther from the peripheral border of metal posts 21, the characteristics of the devices may change between the devices in the vicinity of the peripheral border of the metal posts 21 and the devices farther from the peripheral border of metal posts 21.

When referring to FIGS. 2 to 4, the stress applied to the devices differs between, for example, the region in the layout prohibited region 21a within the metal post 21 and the region in the layout prohibited region 21a outside of the metal post 21. Due to the difference in the stress depending on the regions, the electrical characteristics of the devices may accordingly change depending on the disposed position of the devices even when the devices are the same as each other by having the same type and the same structure and the like.

Further, even when the same devices are disposed in the same layout prohibited region 21a, the stress caused by forming the metal post 21 and applied to the devices differs (changes) between the position that overlaps the peripheral border of the metal posts 21 and the position that does not overlap the peripheral border of the metal posts 21 as illustrated in FIG. 4. Therefore, even when the same devices are disposed at the position overlaps the peripheral border of the metal posts 21 and at the position that does not overlap the peripheral border of the metal posts 21, the electrical characteristics of the same devices may differ from each other due to the difference of the stress applied to the devices.

Further, in a case where the same devices are disposed at positions between the metal posts 21 adjacent to each other, when one device is disposed inside the layout prohibited region 21a and another device is disposed outside the layout prohibited region 21a, the electrical characteristics of the devices may differ from each other due to the difference of the stress between the inside and the outside of the layout prohibited region 21a.

To avoid the inconveniences, it is preferable that the devices such as the transistors 33, resistors 35, the capacitors 37 and the like are disposed so as not to overlap the layout prohibited region 21a. By doing in this way, it may become possible to reduce the influence of the stress caused by the metal posts 21 and accordingly reduce the difference in the electric characteristics of the device between before and after the packaging process.

Figure 5:
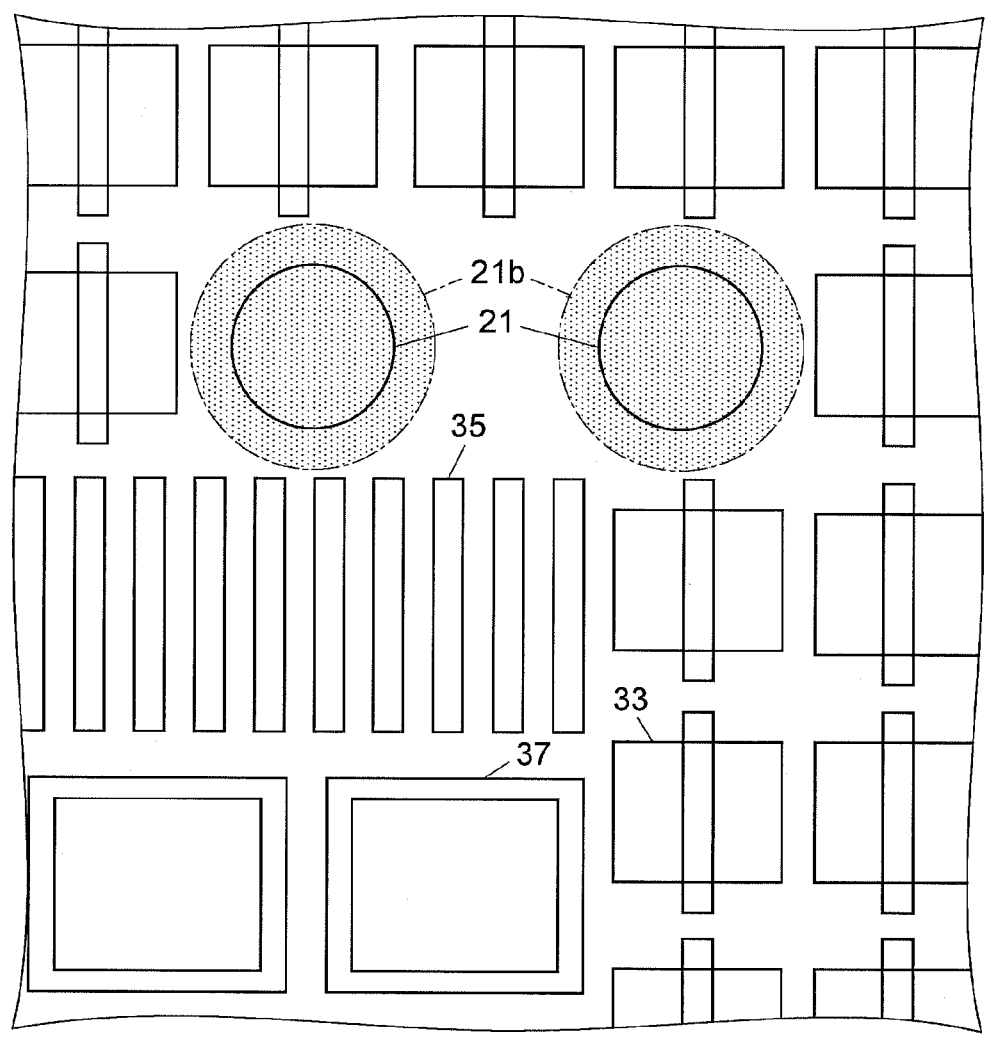
FIG. 5 schematically illustrates a layout of a semiconductor device according to another embodiment of the present invention.

FIG. 5 schematically illustrates a semiconductor device and a layout method of the semiconductor device according to another embodiment of the present invention. Similar to FIG. 2, FIG. 5 schematically illustrates a part of the semiconductor device. In FIG. 5, the ratio of the size of the metal post to the size of the devices does not correspond to the actual ratio. Further, in FIG. 5, the same reference numerals are used to describe the same elements as those in FIG. 2.

In this embodiment of FIG. 5, a layout prohibited region 21b is defined (determined) as a region within a circle having the same center of that of the metal post 21 and having a diameter of 270 μm. Similar to FIG. 2, the devices such as the transistors 33, resistors 35, the capacitors 37 and the like are disposed so as not to overlap the layout prohibited region 21b.

As described above, the stress in the region in the vicinity of the center of the metal post 21 is smaller than the stress in the region in the vicinity of the peripheral border of the metal post 21. However, when it is considered that there is still not a little stress caused by the metal post 21 in the region in the vicinity of the center of the metal post 21, it is preferable that no devices are disposed in the region that overlaps any part of the metal post 21 when viewed from the top.

Further, referring back to FIG. 2, there is a small region under the metal post 21 and inside the concentric circle having the smaller diameter of the two concentric circles defining the layout prohibited region 21a. However, due to the size of the small region, only limited types of the devices may be disposed within the small region.

From this viewpoint, it may be preferable that the positions (region) under the metal post 21 are in the layout prohibited region as the layout prohibited region 21b as illustrated in FIG. 5.

In FIGS. 2 and 5 according to embodiments of the present invention, the devices such as the transistors 33, resistors 35, the capacitors 37 and the like may constitute an analog circuit. The analog circuit includes a reference voltage generation circuit in which a depression-type transistor and an enhancement-type transistor are connected in series, a dividing resistor circuit including plural resistors, a differential amplifier circuit including plural transistors and the like.

The characteristics of the analog circuit may be greatly influenced by the change of the characteristics of the devices constituting the analog circuit. Therefore, as illustrated in FIGS. 2 and 5, by disposing the devices in the region other than the regions where a greater stress due to the metal posts 21 is not received, it may become possible to reduce the difference (change) of the characteristics of the devices and accordingly to reduce the change (alteration) of the characteristics of the analog circuit.

In the semiconductor device and the layout method of the semiconductor device according to an embodiment of the present invention, the devices are not disposed (formed) in a position overlapping the peripheral border of the metal post when viewed from the top of the semiconductor device. By doing this, it may become possible to reduce the difference (change) of the characteristics of the devices between before and after the packaging process in the semiconductor devices which are resin-sealed in the wafer level after the metal post forming process and the resin sealing process are finished.

In a semiconductor device according to an embodiment of the present invention, the devices may not be disposed in positions within a predetermined distance from the peripheral border of the metal post. In other words, the devices are not disposed in a range defined by two borders separated from the peripheral border of the metal post by respective predetermined distances. This is because, in the range, the stress caused by the metal post in the manufacturing is great.

In a layout method of a semiconductor device according to an embodiment of the present invention, the devices may not be disposed in positions within a predetermined distance from the peripheral border of the metal post. In other words, the devices are not disposed in a range defined by two borders separated from the peripheral border of the metal post by respective predetermined distances. This is because, in the range, the stress caused by the metal post in the manufacturing is great.

In this case, the range where the stress caused by the metal post in the manufacturing is great may be determined by previously measuring a semiconductor device having the same package structure as that of the semiconductor device to be manufactured.

In a semiconductor device according to an embodiment of the present invention, the devices may not be disposed in positions overlapping a range within the peripheral border of the metal post when viewed from the top.

In a layout method of a semiconductor device according to an embodiment of the present invention, the devices may not be disposed in positions overlapping a range within the peripheral border of the metal post when viewed from the top.

In a layout method of a semiconductor device according to an embodiment of the present invention, the devices may constitute an analog circuit. In this case, however, the wirings electrically connecting between plural devices constituting the analog circuit and the wirings connected to the analog circuit may be disposed (formed) on the position overlapping the peripheral border of the metal post when viewed from the top.

In a layout method according to an embodiment of the present invention, the devices are disposed in the positions other than the positions overlapping the peripheral border of the metal post when viewed from the top in the semiconductor device that is resin-sealed at a wafer level after the metal post forming process and the resin sealing process are performed. Because of this feature, it may become possible to reduce the difference (change) in the characteristics of the devices between before and after the packaging process.

Further, the characteristics of an analog circuit is greatly influenced by the characteristics of the devices included in the analog device. Therefore, the present invention may be especially effective when a device of the semiconductor device constitutes an analog device.

In the semiconductor device and the layout method according to an embodiment of the present invention, the devices are disposed in the positions other than the positions in a range where an influence of the stress caused by the metal post in the manufacturing process is great and which is defined as a range within a predetermined length from the peripheral border of the metal post. By disposing the devices in this way, it may become possible to eliminate the influence of the stress caused by the metal post and further reduce the difference of the characteristics of the devices between before and after the packaging process.

According to an embodiment of the present invention, there is provided a semiconductor device that is resin-sealed in a wafer level after a rewiring layer forming process and a metal post forming process forming a metal post are performed on a semiconductor substrate of the semiconductor device. The semiconductor device includes devices formed on the semiconductor substrates. All of the devices are disposed in respective positions other than positions overlapping a peripheral border of the metal post when viewed from a top of the semiconductor substrate.

According to another embodiment of the present invention, all of the devices may be disposed in respective positions other than positions within a predetermined distance from the peripheral border of the metal post.

According to another embodiment of the present invention, all of the devices may be disposed in respective positions other than positions overlapping a range within the peripheral border of the metal post.

According to another embodiment of the present invention, the devices may constitute an analog circuit.

According to another embodiment of the present invention, there is provided a layout method for a semiconductor device that is resin-sealed in a wafer level after a rewiring layer forming process and a metal post forming process forming a metal post are performed on a semiconductor substrate of the semiconductor device. The semiconductor device includes devices formed on the semiconductor substrates. The layout method includes a disposing step of disposing the devices in a manner that all of the devices are disposed in respective positions other than positions overlapping a peripheral border of the metal post when viewed from a top of the semiconductor substrate.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

Figure 6:
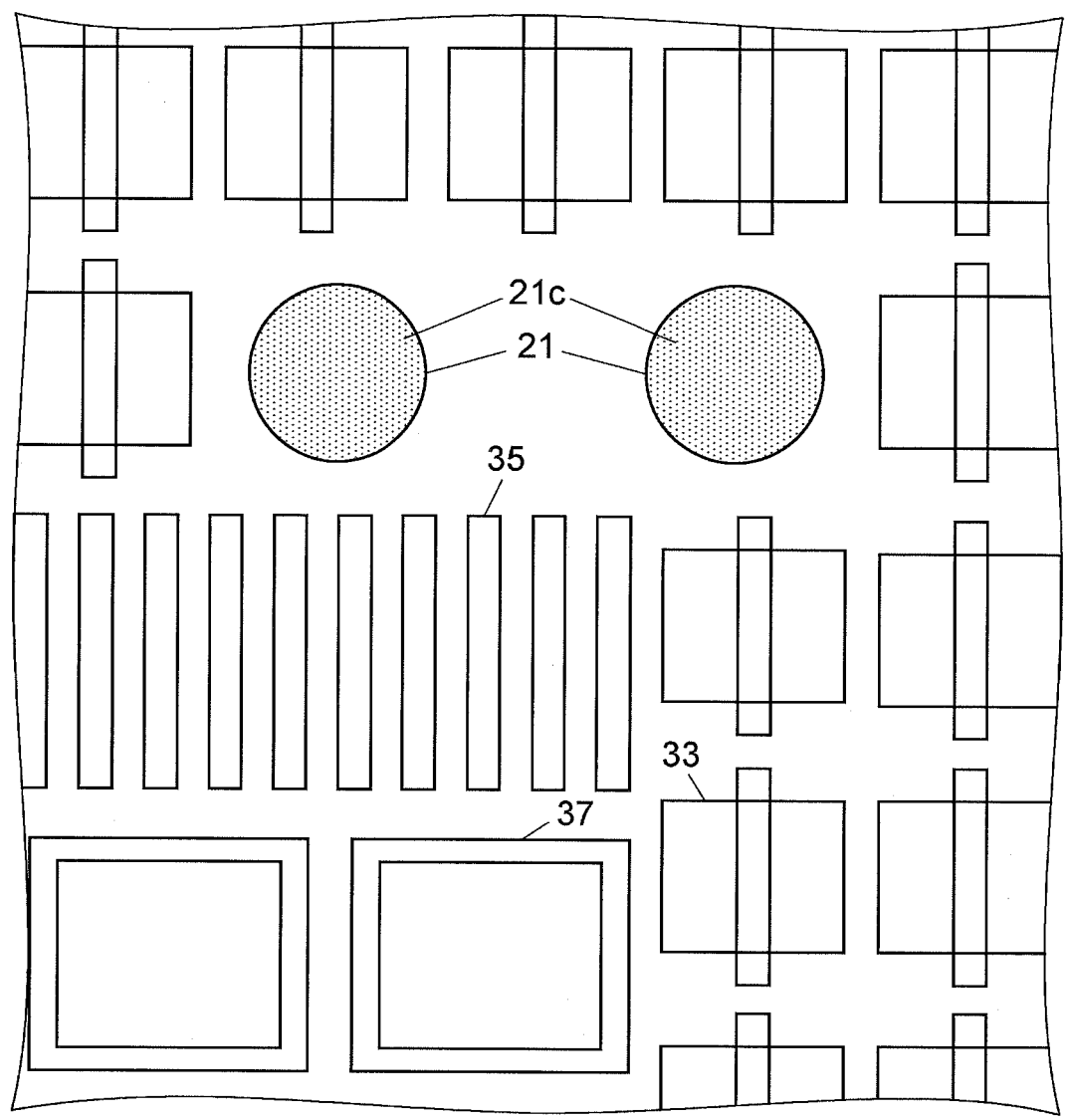
FIG. 6 schematically illustrates a layout of a semiconductor device according to still another embodiment of the present invention.

For example, in the above description, a case is described where the layout prohibited region 21b is defined (determined) as the region within the circle having the same center of that of the metal post 21 and having the diameter of 270 µm. However, the present invention is not limited to this configuration. For example, as illustrated in FIG. 6, the layout prohibited region may be determined as a layout prohibited region 21c which is the same as the region of the metal post 21 when viewed from the top.

The present invention may be applied to a semiconductor device that is resin-sealed in a wafer level after the rewiring layer forming process, the metal post forming process, and the resin sealing process are performed and a layout method for the semiconductor device. Particularly, the present invention may preferably be applied to a semiconductor device including an analog circuit and a layout method for the semiconductor device.

What is claimed is:

1. A semiconductor device that is resin-sealed in a wafer level after a rewiring layer forming process and a metal post forming process forming a metal post are performed on a semiconductor substrate of the semiconductor device, the semiconductor device including active devices formed on the semiconductor substrate,
   wherein all of the devices are disposed in respective positions other than positions overlapping a peripheral border of the metal post which is surrounded by said active devices, when viewed from a top of the semiconductor substrate, and
   wherein the metal post is disposed on an electrode pad.

2. The semiconductor device according to claim 1,
   wherein all of the devices are disposed in respective positions other than positions within a predetermined distance from the peripheral border of the metal post.

3. The semiconductor device according to claim 1,
   wherein all of the devices are disposed in respective positions other than positions overlapping a range within the peripheral border of the metal post.

4. The semiconductor device according to claim 1,
   wherein the devices constitute an analog circuit.

5. A layout method for a semiconductor device that is resin-sealed in a wafer level after a rewiring layer forming process and a metal post forming process forming a metal post are performed on a semiconductor substrate of the semiconductor device, the semiconductor device including active devices formed on the semiconductor substrate, the layout method comprising:
   disposing the metal post on an electrode pad, and
   disposing the devices in a manner that all of the devices are disposed in respective positions other than positions overlapping a peripheral border of the metal post which is surrounded by said active devices, when viewed from a top of the semiconductor substrate.

6. The layout method according to claim 5,
   wherein, in the disposing, all of the devices are disposed in positions other than positions within a predetermined distance from the peripheral border of the metal post.

7. The layout method according to claim 5,
   wherein, in the disposing, all of the devices are disposed in positions other than positions overlapping a range within the peripheral border of the metal post.

8. The layout method according to claim 5,
   wherein the devices constitute an analog circuit.

9. The layout method according to claim 5, further comprising:
   determining an layout prohibited region based on a position of the metal post,
   wherein, in the disposing, the devices are disposed in a manner that all of the devices are disposed in respective positions in regions other than the layout prohibited region.

10. A semiconductor device that is resin-sealed in a wafer level after a rewiring layer forming process and a metal post forming process forming a metal post are performed on a semiconductor substrate of the semiconductor device, the semiconductor device including active devices formed on the semiconductor substrate,
   wherein all of the active devices are disposed in respective positions other than positions overlapping a peripheral border of the metal post which is surrounded by said active devices, when viewed from a top of the semiconductor substrate,
   wherein the metal post is disposed on an electrode pad, and
   wherein the active devices are comprised of at least a part of an analog circuit.

* * * * *